United States Patent [19]

Czeschka

[11] 4,391,482
[45] Jul. 5, 1983

[54] SPRING STRIPS FOR CONNECTIONS BETWEEN PRINTED CIRCUIT BOARD

[76] Inventor: Franz Czeschka, Talstrasse 7, Rechberghausen, Fed. Rep. of Germany, D7324

[21] Appl. No.: 32,126

[22] Filed: Apr. 23, 1979

[30] Foreign Application Priority Data

Apr. 21, 1978 [CH] Switzerland .................. 4318/78

[51] Int. Cl.³ .......................................... H01R 11/22
[52] U.S. Cl. .......................... 339/59 M; 339/276 SF; 29/845
[58] Field of Search ................ 29/626, 628, 625, 747, 29/630 R, 845; 174/68.5; 339/221 M, 221 R, 59 M, 176 M, 192 R, 276 SF; 206/329, 328

[56] References Cited

U.S. PATENT DOCUMENTS 3,732,529  5/1973  Weisenburger ............ 339/221 M X
3,807,045  4/1974  Bennett et al. ............... 29/630 R X
4,045,868  9/1977  Ammon et al. ................... 29/628 X Primary Examiner—Francis S. Husar
Assistant Examiner—Carl J. Arbes
Attorney, Agent, or Firm—Toren, McGeady and Stanger

[57] ABSTRACT

The invention relates to a method and a contact strip for the production of gas-tight connections for printed backwall wirings. Heretofore, the difficulty in the production of such connections has been that the posts of the relatively small and delicate plug connectors had to be pressed into the through-contacted bores under high pressure. The invention solves this problem in that, in pressing in, use is made of a contact strip housing which, during the pressing operation, presses not on the plug connectors themselves, but on their mount, with which the individual plug connectors are firmly held together.

3 Claims, 6 Drawing Figures

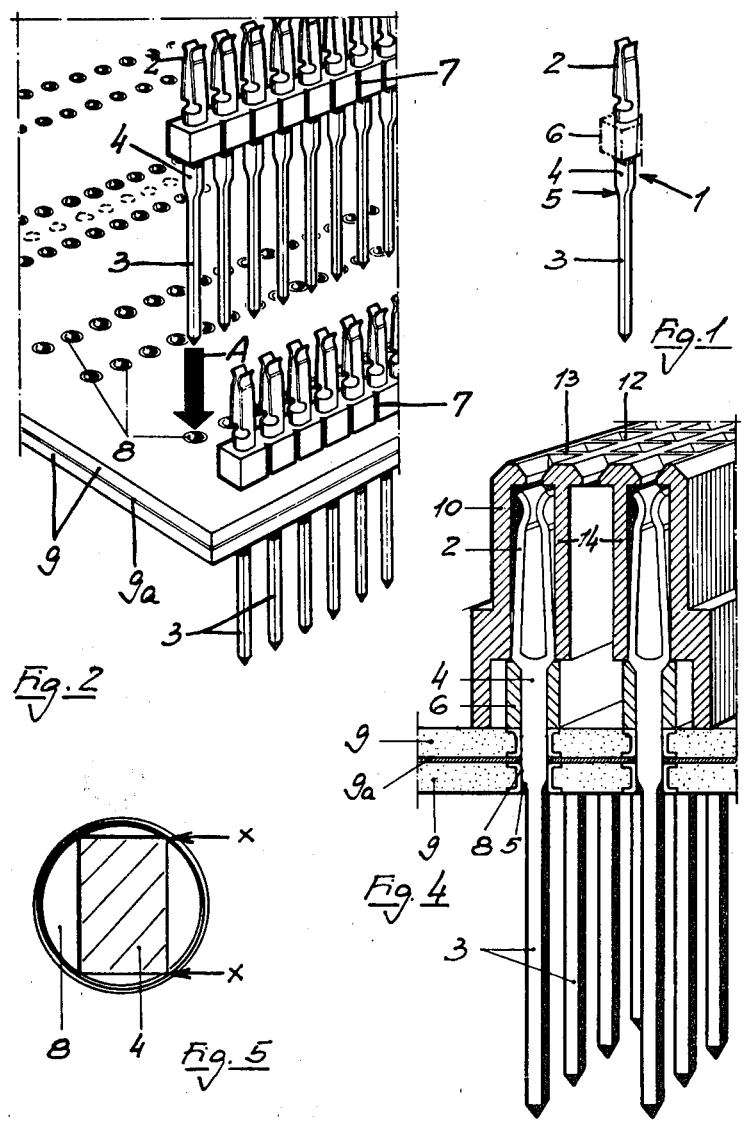

SPRING STRIPS FOR CONNECTIONS BETWEEN PRINTED CIRCUIT BOARD

BACKGROUND OF THE INVENTION

The present invention pertains to a method for making electrically conductive, vibration-proof and gas-tight connections between the printed backwall wiring of through-contacted printed circuit boards and the contact springs of a so-called spring strip, as well as to a spring strip specifically suitable for the practice of the method.

In electronics, the so-called system construction has for some time been gaining in general use; modern equipments being manufactured for plug-in module technique. The connection of the individual modules, e.g., in the form of printed circuit boards, is effected through plug connectors or spring strips, and on the back of the associated elements through a wiring to be applied. Besides the well-known practice of hand soldering, other methods have been adopted to make such backwall wirings, as for instance the "wire wrap" technique, the so-called clamp technique, or the printed circuit board backwall wiring referred to as "motherboard technique".

In the known "motherboard technique", the electrical connection is made through conductor lines of a printed circuit laid out as backwall wiring, the latter assuming both the mechanical fixation and that of the plug connectors; the electric contact between printed circuit and plug connector being established by soft soldering.

Another conventional practice is to press single contacts into through-contacted bores of the printed circuit boards individually by means of appropriate forced fits, but this is extremely time-consuming and hence expensive and moreover is susceptible to error.

SUMMARY OF THE INVENTION

The present invention relates to the "motherboard technique" and its primary object is to establish vibration-proof, gas-tight connections, easy to manufacture and operationally safe, between printed circuit boards and correspondingly conceived spring strips.

Another important object of the present invention is to provide a method and a spring strip suitable specifically and in detail for the practice of this method, by means of which a gas-tight and at the same time vibration- and corrosion-proof and operationally safe connection can be produced for printed circuit boards backwall wired and through-contacted by applied pressure, in a simple manner and without expensive manufacturing or assembly methods.

This problem is solved essentially by combining several contact springs through a mount to form a strip-type line-up, inserting the free ends of the wrapping posts of one or more of these rows up to appropriate enlargements at the base of the post into the through-contacted bores of at least one printed circuit board coated on both sides, applying an appropriately designed spring strip housing on the contact springs with inner bearings against the mount, and subsequently pressing the enlargements into the bores by means of a ram of a pressing device acting on the top side of the spring strip housing.

The individual process steps, their advantages and the structural elements specifically suited for the practice of the process are illustrated in the drawings and explained in greater detail in the following with reference thereto.

BRIEF DESCRIPTION OF THE DRAWINGS

FIG. 1 is a perspective view of a contact spring embodying the invention;

FIGS. 2 and 3 are perspective views, showing various steps in the process of the invention;

FIG. 4 is a sectional view taken through a finished connection;

FIG. 5 is a greatly enlarged transverse section, taken through one of the contact points.

DESCRIPTION OF THE PREFERRED EMBODIMENT

Figure 3:
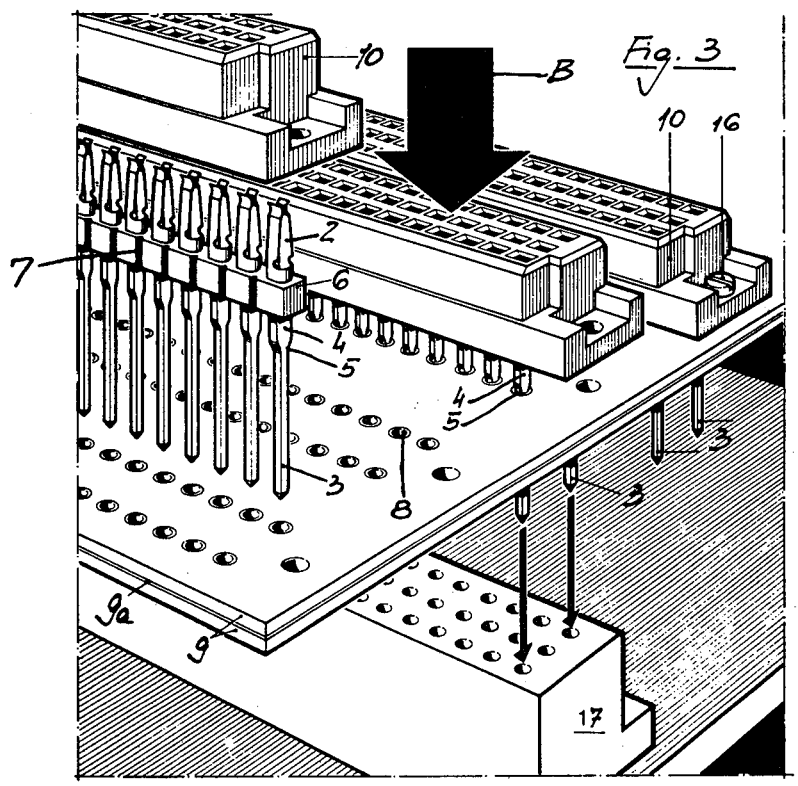

The contact spring 1 shown in FIG. 1 consists of a spring contact 2, wrapping post 3, and the enlargement 4 serving as press-in connection and having a continuous, preferably parabolic transition 5.

As FIG. 2 shows, several of these contact spring 1 are combined by means of a mount 6 to form a kind of strip; this strip can be formed by cladding of the parts 1 with plastic and can be provided with tear lines 7, so as to be able to provide any desired or necessary number of contacts by simply breaking off an appropriate piece from the strip. Another basic element for the production of the connection according to the invention is at least one double-coated, backwall-wired printed circuit board with through-contacted bores 8. When using two or more of these boards one above the other, an insulation foil 9a or the like must be placed between them, as shown in FIG. 4. A third and last basic element, finally, is a specially designed spring strip housing 10, which will be described in greater detail presently.

Figure 6:
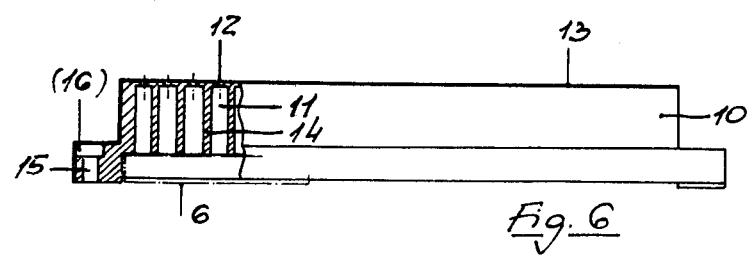
FIG. 6 is a spring strip housing, in side view, partially in section.

FIGS. 2 and 3 together illustrate the process of the invention in its individual steps: One or more of the strips 6 are inserted in the direction of arrow A into the bores 8 until the enlargements 4 serving as press-in connections press against the edge of the hole. Then the spring strip housing 10 is cupped over, which according to FIG. 6 is shaped and dimensioned so that struts 14 or the like projecting from the housing top 13 in the interior rest on the one hand on the strips 6, and on the other hand form by crosswise arrangement relative to each other chambers 11 with upper openings 12. By applying a pressing force according to arrow B onto the housing top 13, which can be done for example with a flat ram of a pressing device with backstop 17, the enlargements 4 are now pressed into the through-contact bores 8; the struts 14 providing for a uniform propagation of force, and the parabolic transitions 5 providing a good sliding insertion. FIG. 4 shows the end position of the individual elements relative to each other. FIG. 5 shows, in the corner regions X, the positive connection between the press-in connection 4 and bore 8. Lastly, the spring strip housing 10 is fixed relative to the board or boards 9 in the flange region 15 by means of screws 16.

What I claim is:

1. A spring strip for making electrically conducting, vibration-stable and gasproof connections between the printed back wall wiring of through-contacted printed circuit boards, and the actual contact springs, the latter being combined via an insulating mount with mutual spacing to strips of at least one row, and these in turn being surrounded by a housing (10) placed thereon, characterized in that the individual strips consisting of contact springs (1) and insulating retention strip (6) clad together;

said insulating strip (6) having lines of weakness formed between pairs of adjacent contact springs, whereby the strip can be broken off at any desired number of contact springs;

said housing (10) having cross pieces (14) that bear against said insulating retention strip (6) between each of the contact springs (1), forming chambers (11).

2. A spring strip according to claim 1, characterized in that the transition (5) from the wrapping post (3) to the enlargement (4) serving as press-on connection of each contact spring (1) extends steadily, and preferably parabolically.

3. A spring strip for making electrically conducting, vibration-stable and gas-proof connections with the printed back wall wiring of printed circuit boards having through-contacted bores provided therein, comprising:

a plurality of linearly aligned, equidistantly spaced apart spring contacts (2) that are embedded for a portion of their respective lengths in an insulating mounting strip (6), serving to accurately locate said contacts with respect to one another, and to fixedly hold said contacts in position;

each of said spring contacts having a pair of opposed spring fingers at one end and a wrapping post (3) at the other end;

a housing (10) having cross pieces (14) that define a plurality of compartments in which said spring fingers are received, said cross pieces bearing against said insulating mounting strip to hold the latter with its associated spring contacts firmly against the circuit board with said wrapping posts projecting through the bores in the circuit board; and said insulating mounting strip having lines of weakness formed therein between adjacent pairs of spring contacts, whereby the mounting strip can be broken off at any desired number of spring contacts.

* * * * *